(12) United States Patent
Zhou et al.

(10) Patent No.: US 10,923,551 B2
(45) Date of Patent: Feb. 16, 2021

(54) DISPLAY PANEL WITH STRETCHING UNITS AND DISPLAY DEVICE HAVING THE SAME

(71) Applicant: BOE TECHNOLOGY GROUP CO., LTD., Beijing (CN)

(72) Inventors: Xiang Zhou, Beijing (CN); Zhongyuan Sun, Beijing (CN); Weijie Wang, Beijing (CN); Zhiqiang Jiao, Beijing (CN); Jingkai Ni, Beijing (CN); Wenqi Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 2 days.

(21) Appl. No.: 16/424,129

(22) Filed: May 28, 2019

(65) Prior Publication Data

US 2020/0074923 A1    Mar. 5, 2020

(30) Foreign Application Priority Data

Aug. 29, 2018 (CN) .......................... 2018 1 0998233

(51) Int. Cl.
| | |
|---|---|
| *G06F 1/16* | (2006.01) |
| *H01L 27/32* | (2006.01) |
| *H01L 51/00* | (2006.01) |
| *G09G 3/3225* | (2016.01) |

(52) U.S. Cl.
CPC ........ *H01L 27/3276* (2013.01); *G06F 1/1652* (2013.01); *H01L 51/0097* (2013.01); *G09G 3/3225* (2013.01); *G09G 2380/02* (2013.01)

(58) Field of Classification Search
CPC .............. H01L 27/3276; H01L 5/0097; G09G 2300/0426; G06F 1/1652; G02F 1/133305
See application file for complete search history.

(56) References Cited

U.S. PATENT DOCUMENTS

| | | | |
|---|---|---|---|
| 2016/0146979 A1 | 5/2016 | Lim | |
| 2016/0240593 A1* | 8/2016 | Gu | ........................ G09G 3/3225 |
| 2018/0046221 A1* | 2/2018 | Choi | ................... H01L 27/3262 |

FOREIGN PATENT DOCUMENTS

| | | | |
|---|---|---|---|
| CN | 105514115 | 4/2016 | |
| CN | 107731866 | 2/2018 | |
| CN | 207624291 | 7/2018 | |
| CN | 207624291 U | * 7/2018 | ............. H01L 51/52 |

OTHER PUBLICATIONS

1st Office Action dated May 7, 2020 for Chinese Patent Application No. 201810998233.3.

* cited by examiner

*Primary Examiner* — Laurence J Lee
(74) *Attorney, Agent, or Firm* — Thomas | Horstemeyer LLP

(57) ABSTRACT

A display panel is described that has stretching units connecting display units. Each of the stretching units includes an annular deformation portion and connection portions, where one end of each of the connection portions is connected to the deformation portion while the other end of each of the connection portions is connected to the display unit. When the display panel is stretched, the deformation portion of the stretching unit is elastically deformed.

14 Claims, 6 Drawing Sheets ically.

DISPLAY PANEL WITH STRETCHING UNITS AND DISPLAY DEVICE HAVING THE SAME

CROSS-REFERENCE TO RELATED APPLICATION

This application is based upon, and claims the benefit of and priority to, Chinese Patent Application No. 201810998233.3, filed on Aug. 29, 2018, the entire contents thereof are incorporated herein by reference.

TECHNICAL FIELD

The present disclosure generally relates to the field of display technologies and, more particularly, to a display panel and a display device having the same.

BACKGROUND

In recent years, the market share of AMOLED (Active Matrix Organic Light-Emitting Diode) display products has increased year by year, and related research and development are very rapid, especially flexible display technologies which provide the most significant advantages of AMOLED devices as opposed to TFT-LCD devices. Currently, bendable and foldable AMOLED flexible display devices are being actively developed by major manufacturers and, further, shape-changeable and stretchable display devices are directions of future development for display technologies, for example, for use in wearable display devices, skin display devices, and the like.

In an existing display panel, each of the substrate layers, thin film transistor layers, EL layers, encapsulation layers, and the like have a certain degree of bending properties, but the stretchable amount is extremely limited. If the display panel is directly stretched, each film layer may be broken or irreversibly deformed in different degrees. How to improve the stretching amount of the display panel without damaging materials of each layer and the display structure of the display panel is currently a hot area for research and development.

SUMMARY

The present disclosure provides a display panel.

The present disclosure also provides a display device including the display panel.

The display panel according to a first aspect of embodiments of the present disclosure includes an underlying film, a plurality of display units, and a plurality of stretching units. Both the plurality of display units and the plurality of stretching units are arranged on the underlying film. Each of the stretching units includes an annular deformation portion and a plurality of connection portions, where one end of each of the connection portions is connected to the deformation portion while the other end of each of the connection portions is connected to the display unit. The stretching unit is constructed in such a way that the deformation portion of the stretching unit is elastically deformed when the display panel is stretched.

According to some embodiments of the present disclosure, the plurality of display units are arranged in multiple rows and multiple columns.

According to some embodiments of the present disclosure, two adjacent rows of the display units are arranged in a staggered manner.

According to some embodiments of the present disclosure, two adjacent display units are connected by the stretching unit.

Specifically, each of the stretching units includes four connection portions, and the four connection portions are connected to four display units respectively. Each of the display units is connected to four stretching units, and a first hollowed-out region is defined between two adjacent display units and two stretching units connected between the two adjacent display units.

According to some embodiments of the present disclosure, a second hollowed-out region corresponding to the first hollowed-out region is provided on the underlying film.

According to some embodiments of the present disclosure, the deformation portion is designed into a circular ring shape or an elliptical ring shape.

According to some embodiments of the present disclosure, the plurality of connection portions are distributed in a circumferential direction of the deformation portion at uniform intervals.

According to some embodiments of the present disclosure, a smooth transition is provided between the one end of the connection portion and the deformation portion, and a smooth transition is provided between the other end of the connection portion and the display unit.

According to some embodiments of the present disclosure, both a width of the one end of the connection portion and a width of the other end of the connection portion are greater than a width of a middle part of the connection portion.

According to some embodiments of the present disclosure, a junction between the connection portion and the deformation portion is a stress concentration region, where at least one first protrusion portion is provided on at least one of an outer surface and an inner surface of the stress concentration region, and where the first protrusion portion protrudes from the outer surface or the inner surface of the stress concentration region.

According to some embodiments of the present disclosure, at least one second protrusion portion is provided on at least one of an outer surface and an inner surface of another region excluding the stress concentration region of the stretching unit, and the second protrusion portion protrudes from the outer surface or the inner surface of the other region.

According to some embodiments of the present disclosure, the underlying film is formed of a polydimethylsiloxane (PDMS), a polyamide thermoplastic elastomer (TPAE), or a thermoplastic polyester elastomer (TPEE).

According to some embodiments of the present disclosure, the display panel includes a thin film transistor, and a scanning signal line and a data signal line of the thin film transistor are arranged on the stretching unit.

A display device according to a second aspect of embodiments of the present disclosure includes the display panel according to the first aspect of the embodiments of the present disclosure.

Additional aspects and advantages of the present disclosure will be set forth in the description which follows, and in part will be apparent from the description, or may be learned by practice of the present disclosure.

BRIEF DESCRIPTION OF THE DRAWINGS

The above and/or additional aspects and advantages of the present disclosure will become apparent and readily comprehensible from the following description of embodiments with reference to the accompanying drawings, in which.

DETAILED DESCRIPTION

The embodiments of the present disclosure are described in detail as below. Examples of the embodiments are as shown in drawings, in which same or similar reference numbers always represent same or similar elements or elements with same or similar functions. The embodiments described with reference to the drawings are examples intended to explain the present disclosure, which are not to be interpreted as limiting the present disclosure.

A display panel 100 according to an embodiment of the present disclosure is described below with reference to FIG. 1-FIG. 11. According to some embodiments of the present disclosure, the display panel 100 may be an active matrix organic light-emitting diode (AMOLED) display panel or a passive matrix organic light-emitting diode (PMOLED) display panel, etc.

Figure 1:
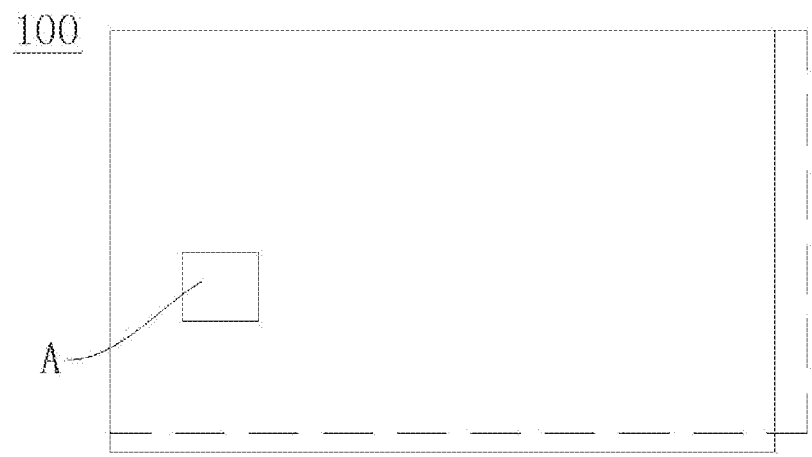
FIG. 1 is a schematic diagram of a display panel according to an embodiment of the present disclosure.
Figure 2:
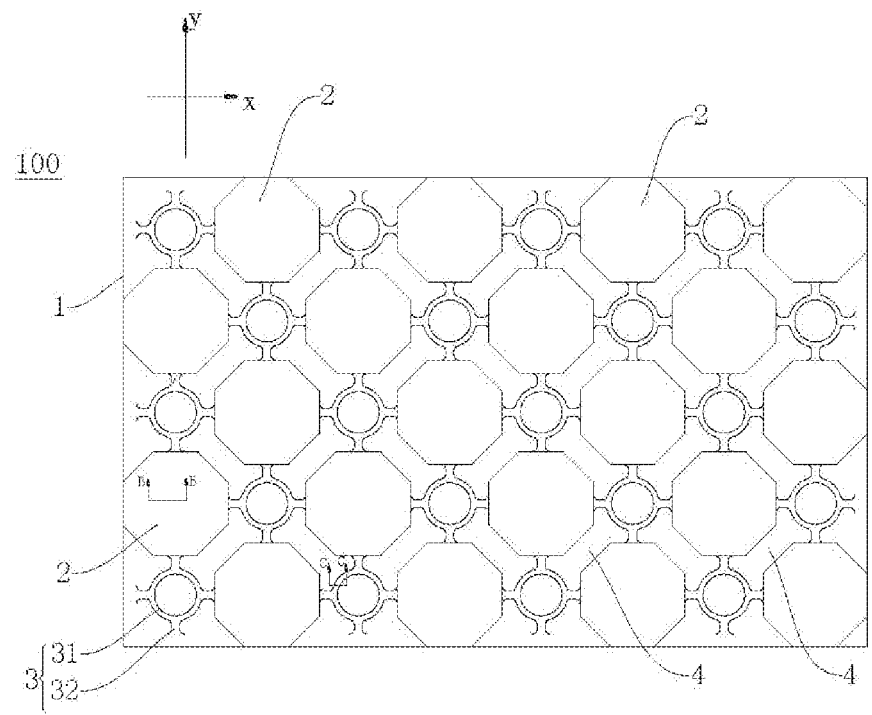
FIG. 2 is an enlarged view schematically showing Portion A in FIG. 1.
Figure 3:
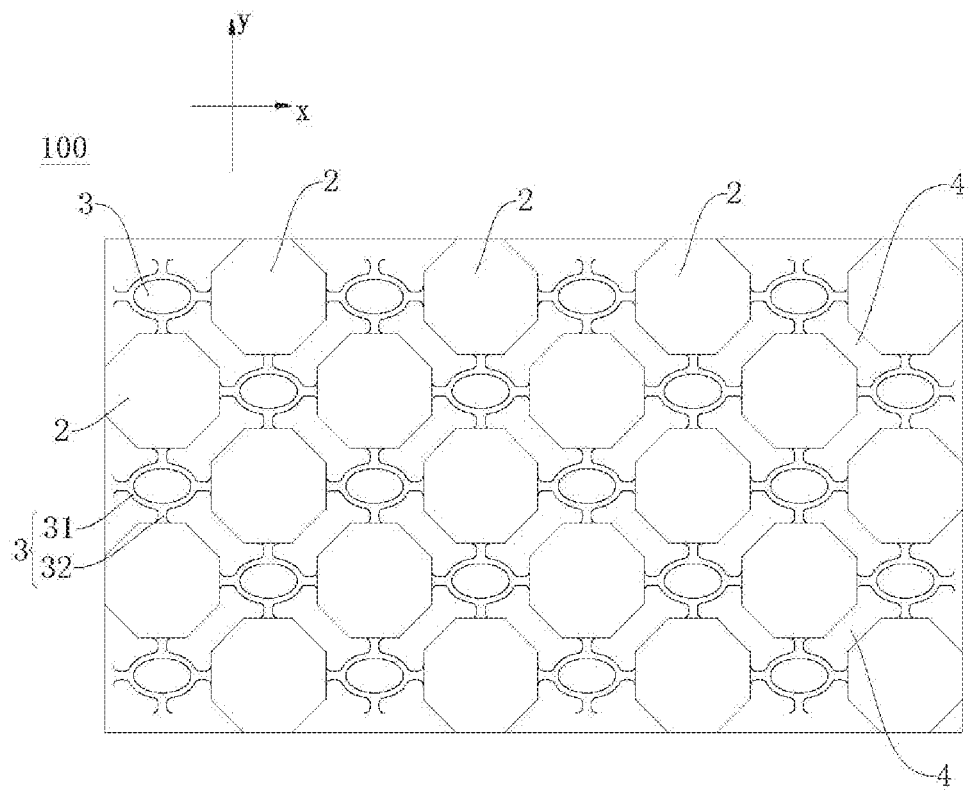
FIG. 3 is a schematic diagram after the display panel as shown in FIG. 2 is stretched.

As shown in FIG. 1-FIG. 3, the display panel 100 according to the embodiment of the present disclosure includes an underlying film 1, a plurality of display units 2, and a plurality of stretching units 3. In the description of the present disclosure, "a plurality of" means two or more.

The plurality of display units 2 and the plurality of stretching units 3 are arranged on the underlying film 1. The underlying film 1 may be configured to carry the above display unit 2 and the stretching unit 3. The underlying film 1 may be a high molecular organic material member. Specifically, the underlying film 1 may be made from a high molecular organic material having better elasticity and toughness. For example, in some embodiments of the present disclosure, the underlying film 1 may be a PDMS (polydimethylsiloxane) member, a TPAE (polyamide thermoplastic elastomer) member, or a TPEE (thermoplastic polyester elastomer) member. The PDMS member, the TPAE member, and the TPEE member are better in elasticity and toughness and lower in material costs.

In some embodiments of the present disclosure, a plurality of display units 2 are spaced apart on the underlying film 1, and two at least partially adjacent display units 2 are connected by a stretching unit 3. Specifically, each two adjacent display units 2 are connected by a stretching unit 3, or two partially adjacent display units 2 are connected by a stretching unit 3.

Figure 9:
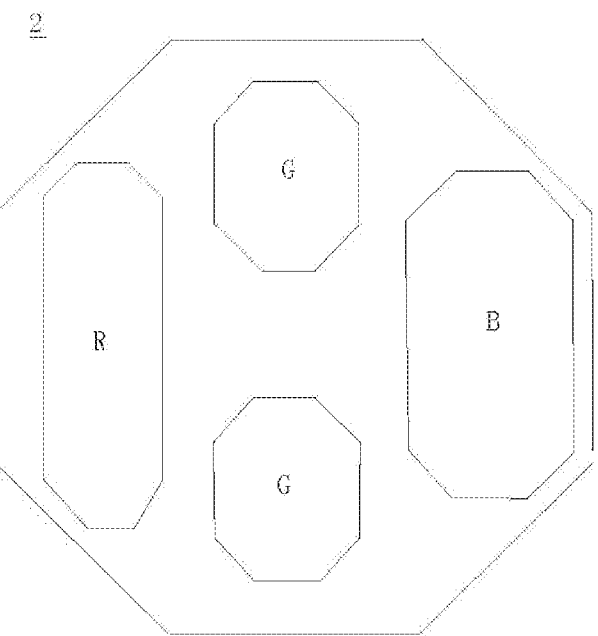
FIG. 9 is a schematic diagram of a display unit according to an embodiment of the present disclosure.
Figure 10:
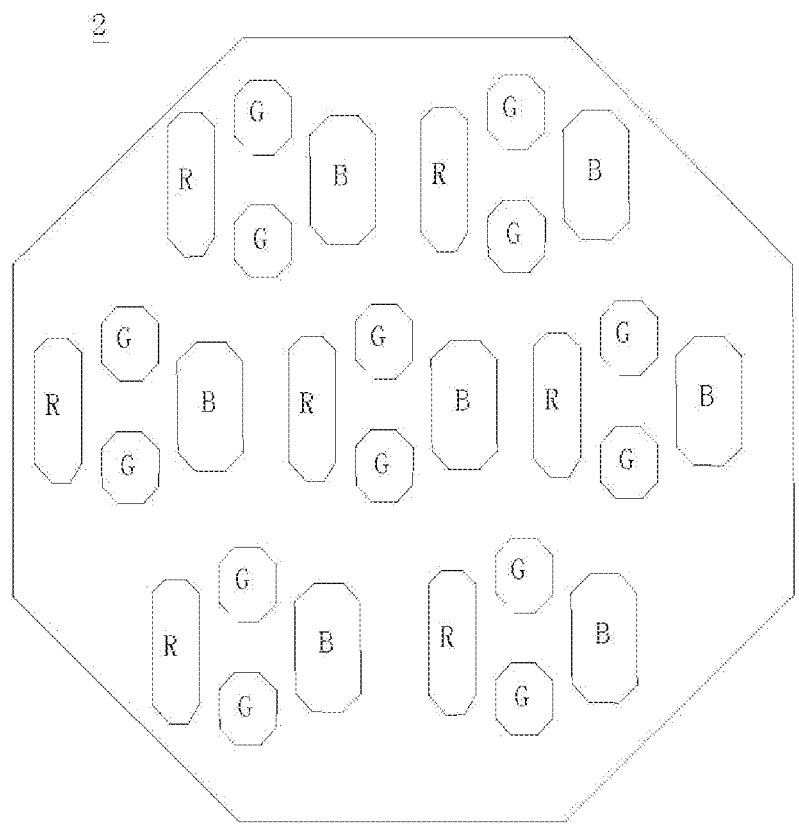
FIG. 10 is a schematic diagram of a display unit according to another embodiment of the present disclosure.

The display unit 2 may be formed in a polygon such as a rectangle, a hexagon, an octagon, or the like, or a rounded polygon. As shown in FIG. 9 and FIG. 10, each display unit 2 may include one or more pixels.

Each stretching unit 3 includes an annular deformation portion 31 and a plurality of connection portions 32. One end of each connection portion 32 is connected to the deformation portion 31, and the other end of each connection portion 32 is connected to the display unit 2. The stretching unit 3 is constructed in such a way that the deformation portion 31 of the stretching unit 3 is elastically deformed when the display panel 100 is stretched. After a stretching force is released, the deformation portion 31 returns to its original shape.

Referring to FIG. 2, FIG. 3, FIG. 6-FIG. 8, the connection portions 32 are formed into a strip shape, and the plurality of connection portions 32 are spaced apart in the circumferential direction of the deformation portion 31. The plurality of connection portions 32 may be radially distributed by centering on the deformation portion 31. Optionally, the plurality of connection portions 32 are evenly spaced apart in the circumferential direction of the deformation portion 31. Thereby, the display units 2 and the stretching units 3 may be arranged properly, and the density of the display units 2 may be increased, which is advantageous to improving the display effect of the display panel 100.

For example, referring to FIG. 1 and FIG. 2, the display panel 100 may be stretched in the direction x and the direction y in FIG. 1. The dashed line portion in FIG. 1 shows a state after the display panel 100 is stretched. When an external force is applied to the display panel 100, the deformation portion 31 of the stretching unit 3 is stretched and elastically deformed, but the connection portion 32 is not deformed, such that stretching of the display panel 100 may be implemented.

In the description of the present disclosure, it is to be understood that the orientations or positions represented by the terms of "center", "inside", "outside", "circumferential direction", and the like are based on the accompanying figures. They are merely for ease of a description of the present disclosure and a simplified description instead of being intended to indicate or imply the device or element to have a special orientation or to be configured and operated in a special orientation. Thus, they cannot be understood as limiting of the present disclosure.

It may be understood that since the plurality of display units 2 are spaced apart from one another, a buffer space in which the deformation portion 31 is deformed may be defined between the adjacent display units 2. Moreover, since the deformation portion 31 is formed to be annular, no small-angle acute angle may be generated when the deformation portion 31 is deformed. Thus, a stress concentration point on the deformation portion 31 is reduced, the stretching unit 3 is effectively prevented from generating a crack or fracture in the stretching process, the stretching amount of the stretching unit 3 is increased, and the stretching reliability of the stretching unit 3 is improved.

For the display panel 100 according to the embodiments of the present disclosure, the deformation portion 31 of the stretching unit 3 is designed to be annular, thus, the stretching unit 3 is effectively prevented from generating a crack or fracture in the stretching process, the stretching amount of the stretching unit 3 is increased, and the stretching reliability of the stretching unit 3 is improved.

According to some embodiments of the present disclosure, the plurality of display units 2 are arranged in a plurality of rows and columns. The structure is simple and the arrangement is convenient. For example, in some specific embodiments of the present disclosure, two adjacent rows of display units 2 are arranged in a staggered manner. Referring to FIG. 2 and FIG. 3, the plurality of display units 2 may be arranged in a row in the direction x and may be arranged in a column in the direction y, and two adjacent rows of display units 2 are arranged in a staggered manner in the direction y. Thereby, the density of the display units 2 may be increased, and the display effect of the display panel 100 may be improved.

It is to be understood that, in some other embodiments of the present disclosure, the plurality of display units 2 also may be arranged in a rectangular array (not shown in the figure). Thereby, the processing technology of the display panel 100 may be simplified, and the production costs may be reduced.

In some embodiments of the present disclosure, two adjacent display units 2 are connected by the stretching unit 3. Thereby, all of the display units 2 may be connected as a whole by the stretching units 3, thereby facilitating the implementation of stretching the display panel 100.

Specifically, in some embodiments of the present disclosure, referring to FIG. 2, FIG. 3 and FIG. 6-FIG. 8, each stretching unit 3 includes four connection portions 32. Optionally, the four connection portions 32 are evenly spaced apart in the circumferential direction of the deformation portion 31. The four connection portions 32 are respectively connected to four display units 2, where each of the display units 2 is connected to four stretching units 3, and a first hollowed-out region 4 is defined between two adjacent display units 2 and two stretching units 3 connected between the two adjacent display units 2. No film layer of the display panel 100 is provided at the first hollowed-out region 4, and the first hollowed-out region 4 is deformed when the display panel 100 is stretched. Thereby, the display units 2 and the stretching units 3 may be arranged more compactly, which is advantageous to increasing the density of the display units 2. Meanwhile, the flexibility of the display panel 100 may be increased, and the stress on the display panel 100 may be reduced, thereby facilitating the display panel 100 to be deformed in the stretching process and preventing the display panel 100 from being abnormally deformed in the stretching process.

According to some embodiments of the present disclosure, a second hollowed-out region corresponding to the first hollowed-out region 4 is provided on the underlying film 1. For example, the second hollowed-out region may be the same as the first hollowed-out region 4 in shape and size. Thereby, the flexibility of the underlying film 1 may be increased, and the stress on the underlying film 1 in the stretching process may be reduced, thereby preventing the underlying film 1 from being abnormally deformed in the stretching process and facilitating the implementation of stretching the display panel 100.

In some embodiments of the present disclosure, the deformation portion 31 is formed into a circular ring shape or an elliptical ring shape. Herein, it is to be noted that the "circular ring shape" and the "elliptical ring shape" in the present application should be understood in a broad sense, that is, they are not necessarily a circular ring or an elliptical ring in a strict sense.

For example, referring to FIG. 2 and FIG. 3, the deformation portion 31 is formed into the circular ring shape, and when the display panel 100 is gradually stretched under a stretching force, the deformation portion 31 of the stretching unit 3 is deformed to change into an elliptical shape. After the stretching force is released, the deformation portion 31 returns to its original shape.

When the deformation portion 31 is formed in the elliptical ring shape and the display panel 100 is gradually stretched under a stretching force, the deformation portion 31 of the stretching unit 3 is deformed, but is still in an elliptical ring shape after the deformation, rather, just being flattened or stretched compared with that before the deformation. After the stretching force is released, the deformation portion 31 returns to its original shape.

No small-angle acute angle is generated in the stretching process of the annular stretching unit 3, which may reduce the risk of causing a crack of the stretching unit 3 to a large extent.

In some embodiments of the present disclosure, a smooth transition is provided between the one end of the connection portion 32 and the deformation portion 31. For example, referring to FIG. 6, a side of the one end of the connection portion 32 is formed into an arc shape. Thereby, the stress between the connection portion 32 and the deformation portion 31 may be reduced, and the reliability of the stretching unit 3 may be improved.

Figure 6:
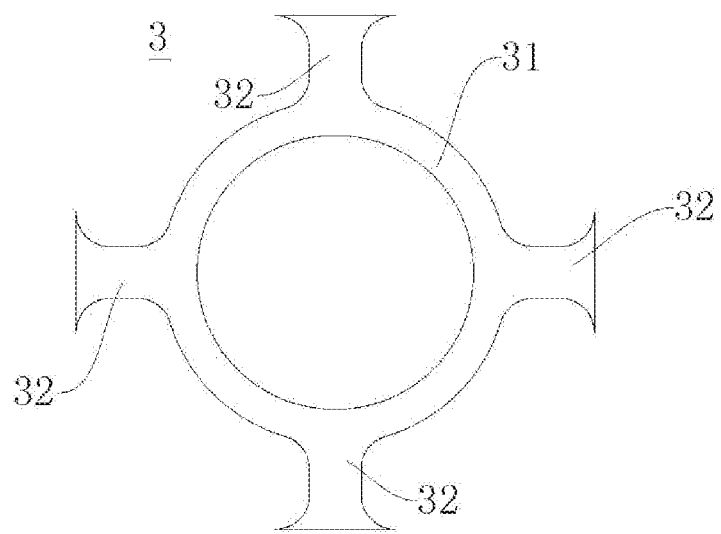
FIG. 6 is a schematic diagram of a stretching unit according to an embodiment of the present disclosure.
Figure 7:
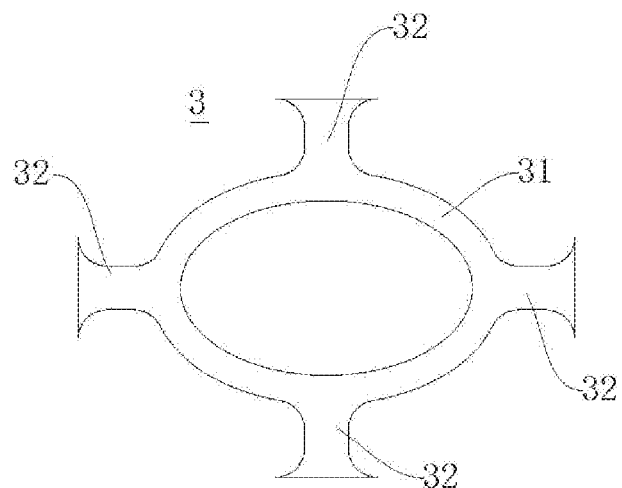
FIG. 7 is a schematic diagram after the stretching unit as shown in FIG. 6 is stretched.
Figure 8:
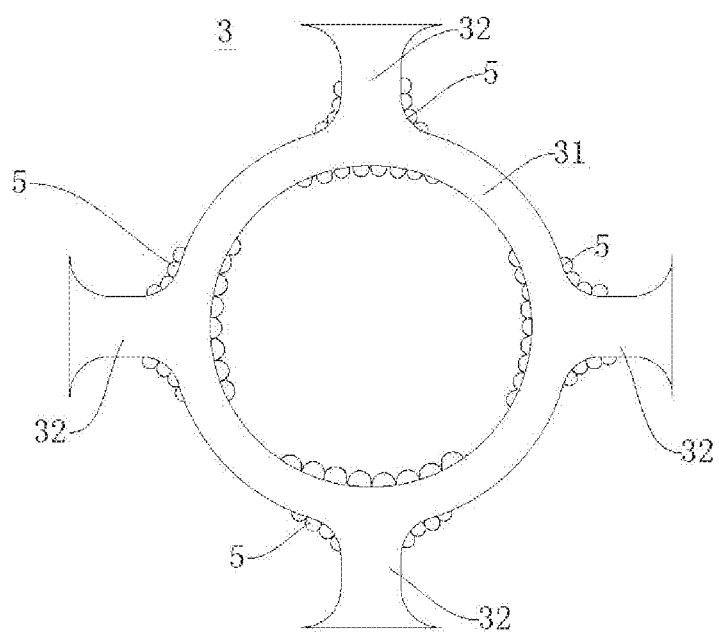
FIG. 8 is a schematic diagram of a stretching unit according to another embodiment of the present disclosure.

In some embodiments of the present disclosure, a smooth transition is provided between the other end of the connection portion 32 and the display unit 2. Referring to FIG. 6, a side of the other end of the connection portion 32 is formed into an arc shape. Thereby, the stress between the connection portion 32 and the display unit 2 may be reduced, and the reliability of the stretching unit 3 may be further improved.

According to some embodiments of the present disclosure, both a width of the one end of the connection portion 32 and a width of the other end of the connection portion 32 are greater than a width of a middle part of the connection portion 32. Thereby, a bearable stress on both ends of the connection portion 32 may be increased, and the reliability of the stretching unit 3 may be improved.

In some embodiments of the present disclosure, a junction between the connection portion 32 and the deformation portion 31 is a stress concentration region, and at least one first protrusion portion 5 is provided on at least one of an outer surface and an inner surface of the stress concentration region. The number of the first protrusion portions 5 may be one or more. For example, the first protrusion portion 5 may be formed into a wave shape. Specifically, the first protrusion portion 5 may be merely provided on the outer surface of the stress concentration region, or the first protrusion portion 5 may be merely provided on the inner surface of the stress concentration region, or the first protrusion portion 5 may be provided on both the outer surface and the inner surface of the stress concentration region. Thereby, the stress generated in the stretching process of the stretching unit 3 may be absorbed by the first protrusion portion 5, such that the risk of generating a crack or fracture of the stretching unit 3 is greatly reduced.

The first protrusion portion 5 protrudes from the inner surface or the outer surface of the stress concentration region. Specifically, when the first protrusion portion 5 is formed on the outer surface of the stress concentration region, the first protrusion portion 5 protrudes in a direction where the outer surface of the stress concentration region faces away from a center of the deformation portion 31. When the first protrusion portion 5 is formed on the inner surface of the stress concentration region, the first protrusion portion 5 protrudes in a direction where the inner surface of the stress concentration region faces close to the center of the deformation portion 31.

It is to be noted that "the outer surface of the stress concentration region" refers to a surface of a side of the stress concentration region away from the center of deformation portion 31, and "the inner surface of the stress concentration region" refers to a surface of a side of the stress concentration region close to the center of deformation portion 31. In some embodiments of the present disclosure, a plurality of second protrusion portions are provided on at least one of an outer surface and an inner surface of another region excluding the stress concentration region of the stretching unit 3 (hereinafter referred to as the other region). For example, the second protrusion portions may be formed into a wave shape. Specifically, the second protrusion portions may be provided merely on the outer surface of the other region excluding the stress concentration region, or the second protrusion portions may be provided merely on the inner surface of the other region excluding the stress concentration region, or the second protrusion portions may be provided on both the outer surface and an inner surface of the other region excluding the stress concentration region. Thereby, the stress generated in the stretching process of the stretching unit 3 may be absorbed by the first protrusion portion 5 and the second protrusion portion, thus further reducing the risk of generating a crack or fracture of the stretching unit 3.

The second protrusion portion protrudes from the inner surface or the outer surface of the other region. Specifically, when the second protrusion portion is formed on the outer surface of the other region, the second protrusion portion protrudes from a direction where the outer surface of the other region faces away from the center of the deformation portion 31. When the second protrusion portion is formed on the inner surface of the other region, the second protrusion portion protrudes from a direction where the inner surface of the other region faces close to the center of the deformation portion 31. It is to be noted that "the outer surface of the other region" refers to a surface of a side of the other region away from the center of deformation portion 31, and "the inner surface of the other region" refers to a surface of a side of the other region close to the center of deformation portion 31.

Figure 4:
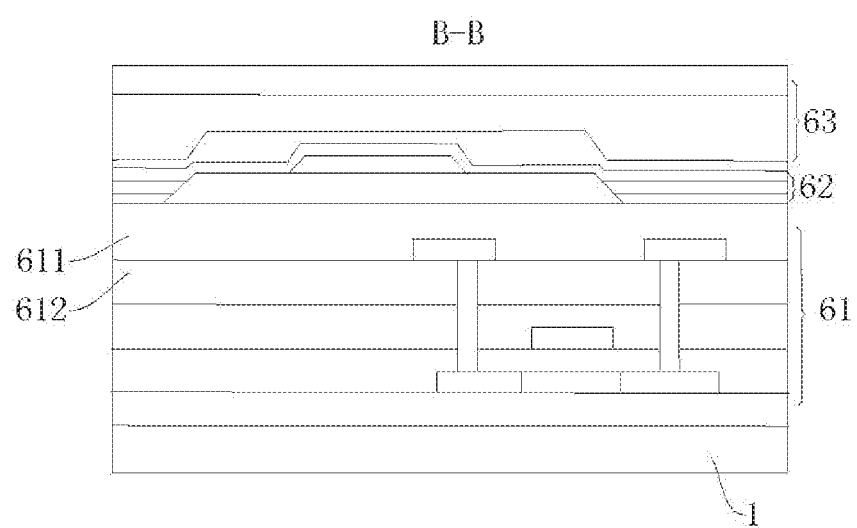
FIG. 4 is a sectional view along Line B-B in FIG. 2.

According to some embodiments of the present disclosure, referring to FIG. 4, the display unit 2 includes an array layer 61, an organic light-emitting diode layer (OLED layer) 62, and a thin film encapsulation layer (TFE layer) 63. The OLED layer 62 is disposed above the array layer 61 and the TFE layer 63 is disposed above the OLED. A region of the display unit 2 is encapsulated by inorganic layer-organic layer-inorganic layer, but is not limited to the thin film encapsulation of three layers, and other types of thin film encapsulations may also be used.

Figure 5:
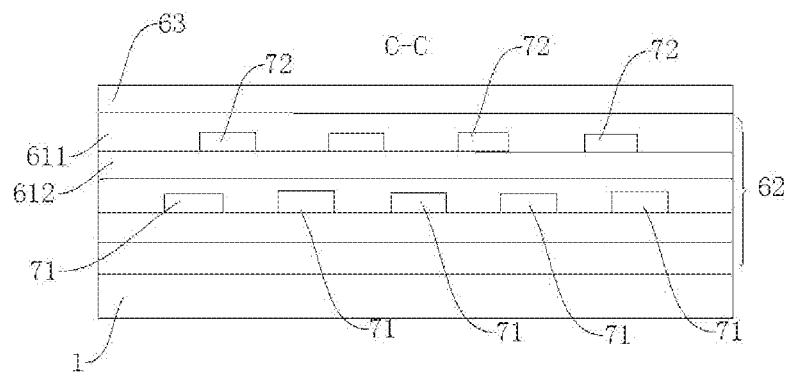
FIG. 5 is a sectional view along Line C-C in FIG. 2.

Referring to FIG. 5, the stretching unit 3 includes an array layer 61 and a TFE layer 63. A PLN layer 611 (planarization layer) in the array layer 61 is an organic planarization layer, and an ILD layer 612 (interlayer dielectric) in the array layer 61 may be either an inorganic layer or an organic layer. Coverage ranges of all the organic layers should be smaller than those of the inorganic layers. According to some embodiments of the present disclosure, the ILD layer 612 is an organic layer, such that the risk of causing a fracture of the stretching unit 3 in the stretching process may be further reduced.

Figure 11:
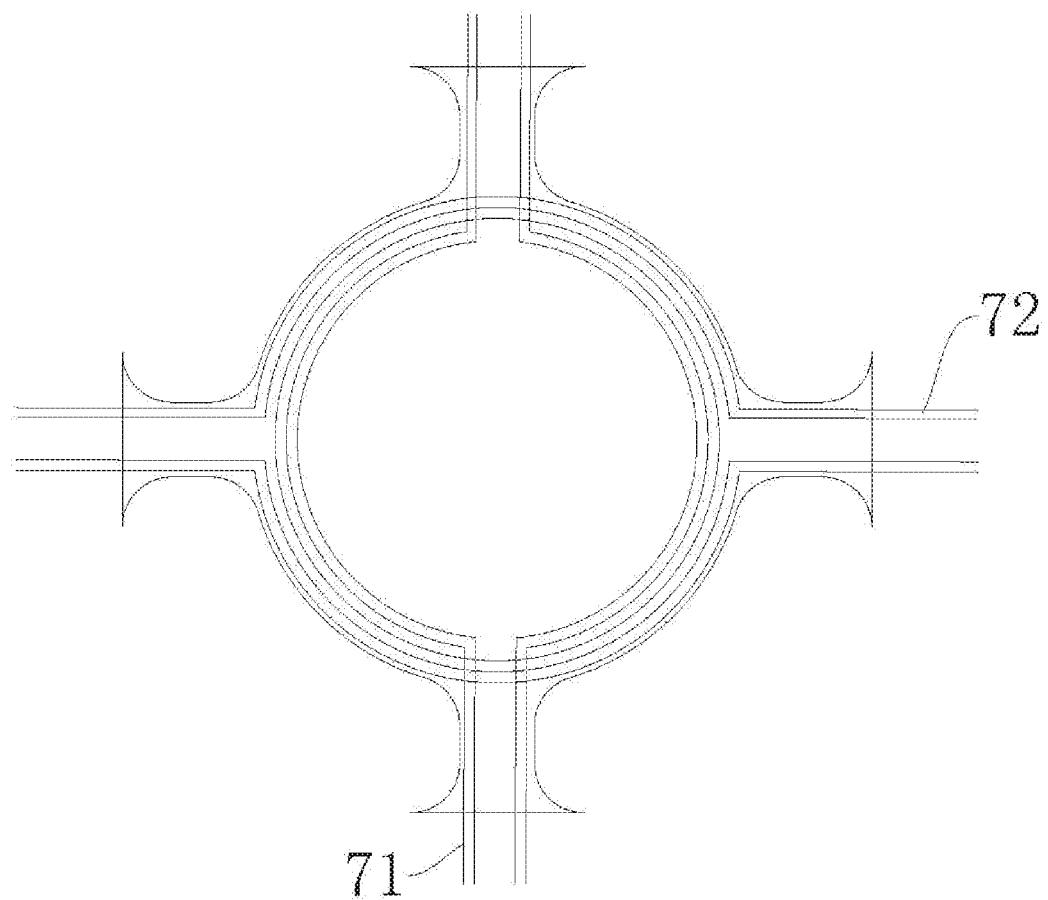
FIG. 11 is a schematic diagram of a stretching unit, a scanning line, and a data line according to an embodiment of the present disclosure.

In some specific embodiments of the present disclosure, the stretching unit 3 is not only configured to provide a stretchable amount of the display device, but also configured to arrange a scanning signal line 71 and a data signal line 72 of the thin film transistor to transmit data and signals. As shown in FIG. 11, both the scanning signal line 71 and the data signal line 72 are arranged on the stretching unit 3. The number of the scanning signal lines 71 and the number of the data signal lines 72 may be three or more. Thereby, the structure of the display panel 100 may be made more compact, which is advantageous to reducing the size of the display panel 100.

Other configurations and operations of the display panel 100 according to the embodiments of the present disclosure are known to those of ordinary skill in the art and will not be described in detail herein.

A display device according to a second aspect of the embodiments of the present disclosure includes the display panel 100 according to the first aspect of the embodiments of the present disclosure.

For the display device according to the second aspect of the embodiments of the present disclosure, by arranging the display panel 100 according to the first aspect of the embodiments of the present disclosure, a stretching amount of the display device is increased, and the display panel 100 may be effectively prevented from being fractured in a stretching process.

Reference throughout this specification to the terms "an embodiment," "some embodiments," "an exemplary embodiment," "an example," "a specific example," or "some examples," means that a specific feature, structure, material, or characteristic described in connection with the embodiment or example is included in at least one embodiment or example of the present disclosure. The schematic representation of the above terms throughout this specification is not necessarily referring to the same embodiment or example. Furthermore, the specific features, structures, materials, or characteristics set forth may be combined in any suitable manner in one or more embodiments or examples.

Although some embodiments of the present disclosure have been illustrated and described, those of ordinary skill in the art may appreciate that various changes, modifications, substitutions, and variations may be made to these embodiments without departing from the principle or spirit of the present disclosure, and the scope of the present disclosure is limited by the claims and equivalents thereof.

What is claimed is:
1. A display panel, comprising:
an underlying film; and
a plurality of display units; and
a plurality of stretching units, the display units and the stretching units being arranged on the underlying film, each of the stretching units comprising an annular deformation portion and a plurality of connection portions, one end of each of the connection portions being connected to the deformation portion while the other end of each of the connection portions being connected to the display unit, the stretching unit being constructed in such a way that the deformation portion of the stretching unit is elastically deformed when the display panel is stretched, wherein:
the plurality of display units are arranged in multiple rows and multiple columns;
two adjacent display units are connected by the stretching unit;
each of the stretching units comprises four connection portions;
the four connection portions are connected to four of the display units respectively;
each of the display units is connected to four of the stretching units; and a first hollowed-out region is defined between two adjacent display units and two stretching units connected between the two adjacent display units.

2. The display panel according to claim 1, wherein two adjacent rows of the display units are arranged in a staggered manner.

3. The display panel according to claim 1, wherein a second hollowed-out region corresponding to the first hollowed-out region is provided on the underlying film.

4. The display panel according to claim 1, wherein the deformation portion is in one of a circular ring shape and an elliptical ring shape.

5. The display panel according to claim 1, wherein the plurality of connection portions are distributed in a circumferential direction of the deformation portion at uniform intervals.

6. The display panel according to claim 1, wherein:
a smooth transition is provided between the end of the connection portion and the deformation portion; and
a smooth transition is provided between the other end of the connection portion and the display unit.

7. The display panel according to claim 1, wherein both a width of the end of the connection portion and a width of the other end of the connection portion are greater than a width of a middle part of the connection portion.

8. The display panel according to claim 1, wherein:
a junction between the connection portion and the deformation portion is a stress concentration region;
at least one first protrusion portion is provided on at least one of an outer surface and an inner surface of the stress concentration region; and
the first protrusion portion protrudes from the at least one of the outer surface and the inner surface of the stress concentration region.

9. The display panel according to claim 8, wherein:
at least one second protrusion portion is provided on at least one of an outer surface and an inner surface of another region excluding the stress concentration region of the stretching unit; and
the second protrusion portion protrudes from the at least one of the outer surface and the inner surface of the another region.

10. The display panel according to claim 1, wherein the underlying film is formed of one of a polydimethylsiloxane (PDMS), a polyamide thermoplastic elastomer (TPAE), and a thermoplastic polyester elastomer (TPEE).

11. The display panel according to claim 1, wherein:
the display panel comprises a thin film transistor; and
a scanning signal line and a data signal line of the thin film transistor are arranged on the stretching unit.

12. A display device comprising a display panel, wherein the display panel comprises:
an underlying film; and
a plurality of display units; and
a plurality of stretching units, the display units and the stretching units being arranged on the underlying film, each of the stretching units comprising an annular deformation portion and a plurality of connection portions, one end of each of the connection portions being connected to the deformation portion while the other end of each of the connection portions being connected to the display unit, the stretching unit being constructed in such a way that the deformation portion of the stretching unit is elastically deformed when the display panel is stretched, wherein:
the plurality of display units are arranged in multiple rows and multiple columns;
two adjacent display units are connected by the stretching unit;
each of the stretching units comprises four connection portions;
the four connection portions are connected to four of the display units respectively;
each of the display units is connected to four of the stretching units; and
a first hollowed-out region is defined between two adjacent display units and two stretching units connected between the two adjacent display units.

13. The display device according to claim 12, wherein two adjacent rows of the display units are arranged in a staggered manner.

14. The display device according to claim 12, wherein a second hollowed-out region corresponding to the first hollowed-out region is provided on the underlying film.

* * * * *